(12) United States Patent
Nishida

(10) Patent No.: US 10,097,191 B2
(45) Date of Patent: Oct. 9, 2018

(54) ATOMIC OSCILLATOR

(71) Applicant: Seiko Epson Corporation, Tokyo (JP)

(72) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 164 days.

(21) Appl. No.: 15/332,185

(22) Filed: Oct. 24, 2016

(65) Prior Publication Data

US 2017/0117911 A1  Apr. 27, 2017

(30) Foreign Application Priority Data

Oct. 27, 2015 (JP) ................................ 2015-210824

(51) Int. Cl.
| | |
|---|---|
| *H03L 7/26* | (2006.01) |
| *H01L 33/40* | (2010.01) |
| *H01S 5/00* | (2006.01) |
| *H01L 31/16* | (2006.01) |
| *H01L 33/60* | (2010.01) |

(Continued)

(52) U.S. Cl.
CPC ............... *H03L 7/26* (2013.01); *G04F 5/145* (2013.01); *H01L 31/16* (2013.01); *H01L 33/40* (2013.01); *H01L 33/60* (2013.01); *H01L 33/64* (2013.01); *H01S 5/00* (2013.01); *H01S 5/18302* (2013.01); *H01S 5/02461* (2013.01); *H01S 5/0425* (2013.01); *H01S 5/18311* (2013.01); *H01S 5/343* (2013.01); *H01S 2301/176* (2013.01)

(58) Field of Classification Search
CPC . H03L 7/26; H01L 33/40; H01L 31/16; H01L 33/60; H01L 33/64; G04F 5/145; H01S 5/02461; H01S 5/0425; H01S 5/18302; H01S 5/18311; H01S 5/343; H01S 2301/176

USPC ................................ 331/3, 94.1; 372/50.124
See application file for complete search history.

(56) References Cited

U.S. PATENT DOCUMENTS

2002/0176459 A1    11/2002  Martinsen
2006/0182162 A1*   8/2006   Yanagisawa .......... H01S 3/0604
                                                        372/70

(Continued)

FOREIGN PATENT DOCUMENTS

| JP | 09-283836 A | 10/1997 |
|---|---|---|
| JP | 2015-062167 A | 4/2015 |
| WO | WO-2015-137174 A1 | 9/2015 |

OTHER PUBLICATIONS

Extended European Search Report for Application No. EP 16 19 5500 dated Apr. 26, 2017 (5 pages).

*Primary Examiner* — Arnold Kinkead
(74) *Attorney, Agent, or Firm* — Harness, Dickey & Pierce, P.L.C.

(57) ABSTRACT

An atomic oscillator includes a gas cell having alkali metal atoms sealed therein; a light source that irradiates the gas cell with light; and a light detecting unit that detects the quantity of light transmitted through the gas cell. The light source includes an optical oscillation layer having a first reflective layer, an active layer, and a second reflective layer laminated therein in this order, an electrical field absorption layer having a first semiconductor layer, a quantum well layer, and a second semiconductor layer laminated therein in this order, and a heat diffusion layer that is disposed between the optical oscillation layer and the electrical field absorption layer and has a higher thermal conductivity than that of the second reflective layer.

4 Claims, 14 Drawing Sheets

(51) Int. Cl.
  *H01L 33/64*   (2010.01)
  *G04F 5/14*    (2006.01)
  *H01S 5/183*   (2006.01)
  *H01S 5/024*   (2006.01)
  *H01S 5/042*   (2006.01)
  *H01S 5/343*   (2006.01)

(56) References Cited

U.S. PATENT DOCUMENTS

| 2007/0002917 | A1  | 1/2007 | Deng |
| 2007/0217461 | A1* | 9/2007 | Masui ............... B82Y 20/00 |
|              |     |        | 372/46.01 |
| 2009/0003401 | A1* | 1/2009 | Sekiguchi ........... H01S 5/18394 |
|              |     |        | 372/50.124 |
| 2015/0054591 | A1  | 2/2015 | Adachi et al. |

* cited by examiner

ATOMIC OSCILLATOR

BACKGROUND

1. Technical Field

The present invention relates to an atomic oscillator.

2. Related Art

An atomic oscillators using transition energy of atoms as reference frequency is widely used as one of highest-precision oscillators in communication base stations or the like. Although there are several types as the atomic oscillator, a microwave double resonance type using a rubidium (Rb) lamp is most generally used.

In recent years, an atomic oscillator using a phenomenon called Coherent Population Trapping (CPT) that is one of quantum interference effects is suggested (for example, refer to JP-A-2015-62167), and reduced size and low power consumption of the atomic oscillator are expected compared with the related art. In the case of the CPT type, sidebands are used for development of a CPT phenomenon by superimposing a high-frequency signal using a coherent light source, such as a laser, as a light source. The CPT type atomic oscillator is an oscillator using an electromagnetically induced transparency (EIT) phenomenon in which if alkali metal atoms are irradiated with coherent light having two different kinds of wavelength (frequency), the absorption of the coherent light stops.

In order to develop the CPT phenomenon as the light source of the atomic oscillator, high-precision adjustment of the output wavelength of a laser element or the like is required. If an inflow current to the laser element or the like is changed, it is possible to adjust the output wavelength.

However, if the inflow current to the laser element is changed, the optical output of the laser element or the like varies simultaneously. Therefore, it is necessary to form a control loop of the atomic oscillator in consideration of this, and complicated control is required. Therefore, a light source that can control its output wavelength and optical output individually is needed.

SUMMARY

An advantage of some aspects of the invention is to provide an atomic oscillator that can control the output wavelength and optical output of a light source individually.

An atomic oscillator according to an aspect of the invention includes a gas cell having alkali metal atoms sealed therein; a light source that irradiates the gas cell with light; and a light detecting unit that detects the quantity of light transmitted through the gas cell. The light source includes an optical oscillation layer having a first reflective layer, an active layer, and a second reflective layer laminated therein in this order, an electrical field absorption layer having a first semiconductor layer, a quantum well layer, and a second semiconductor layer laminated therein in this order, and a heat diffusion layer that is disposed between the optical oscillation layer and the electrical field absorption layer and has a higher thermal conductivity than that of the second reflective layer.

In such an atomic oscillator, in a case where the central wavelength of light exited from the light source is changed by changing the quantity of a current to be flowed into the active layer, even if the optical output (the quantity of light) of the light exited from the light source shifts from a predetermined value, the optical output of the light exited from the light source can be returned to the predetermined value by changing a voltage to be applied to the electrical field absorption layer. Moreover, in such an atomic oscillator, even if the electrical field absorption layer (the quantum well layer) absorbs light to generate heat, this heat can be diffused to the outside via the heat diffusion layer, and this heat can be prevented from reaching the second reflective layer or the active layer. Accordingly, a temperature change in the light source caused by the heat generated in the electrical field absorption layer can be suppressed. Therefore, the central wavelength of the light source can be prevented from fluctuating with temperature, and the output wavelength (central wavelength) and the optical output of the light source can be individually (independently) controlled depending on the quantity of an inflow current to the active layer, and a voltage applied to the electrical field absorption layer.

In the atomic oscillator according to the aspect of the invention, the heat diffusion layer may be an i-type AlAs layer.

In such an atomic oscillator, the heat diffusion layer can be formed in a series of processes (by the same apparatus as an apparatus for forming the optical oscillation layer and the electrical field absorption layer) together with the optical oscillation layer and the electrical field absorption layer.

In the atomic oscillator according to the aspect of the invention, the heat diffusion layer may be an i-type GaAs layer.

In such an atomic oscillator, the heat diffusion layer can be formed in a series of processes together with the optical oscillation layer and the electrical field absorption layer.

The atomic oscillator according to the aspect of the invention may further include a contact layer provided between the heat diffusion layer and the first semiconductor layer, and a surface of the contact layer where the first semiconductor layer is disposed may be provided with an electrode for applying a voltage to the electrical field absorption layer.

In such an atomic oscillator, the contact resistance of the electrode can be reduced compared to a case where the electrode is in direct contact with the first semiconductor layer.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferred embodiment of the invention will be described below in detail with reference to the drawings. It should be noted that the embodiment to be described below does not unduly limit the contents of the invention set forth in the appended claims. Additionally, all the components to be describing below are not necessarily indispensable constituent elements of the invention.

1. Atomic Oscillator 1.1. Configuration

Figure 1:
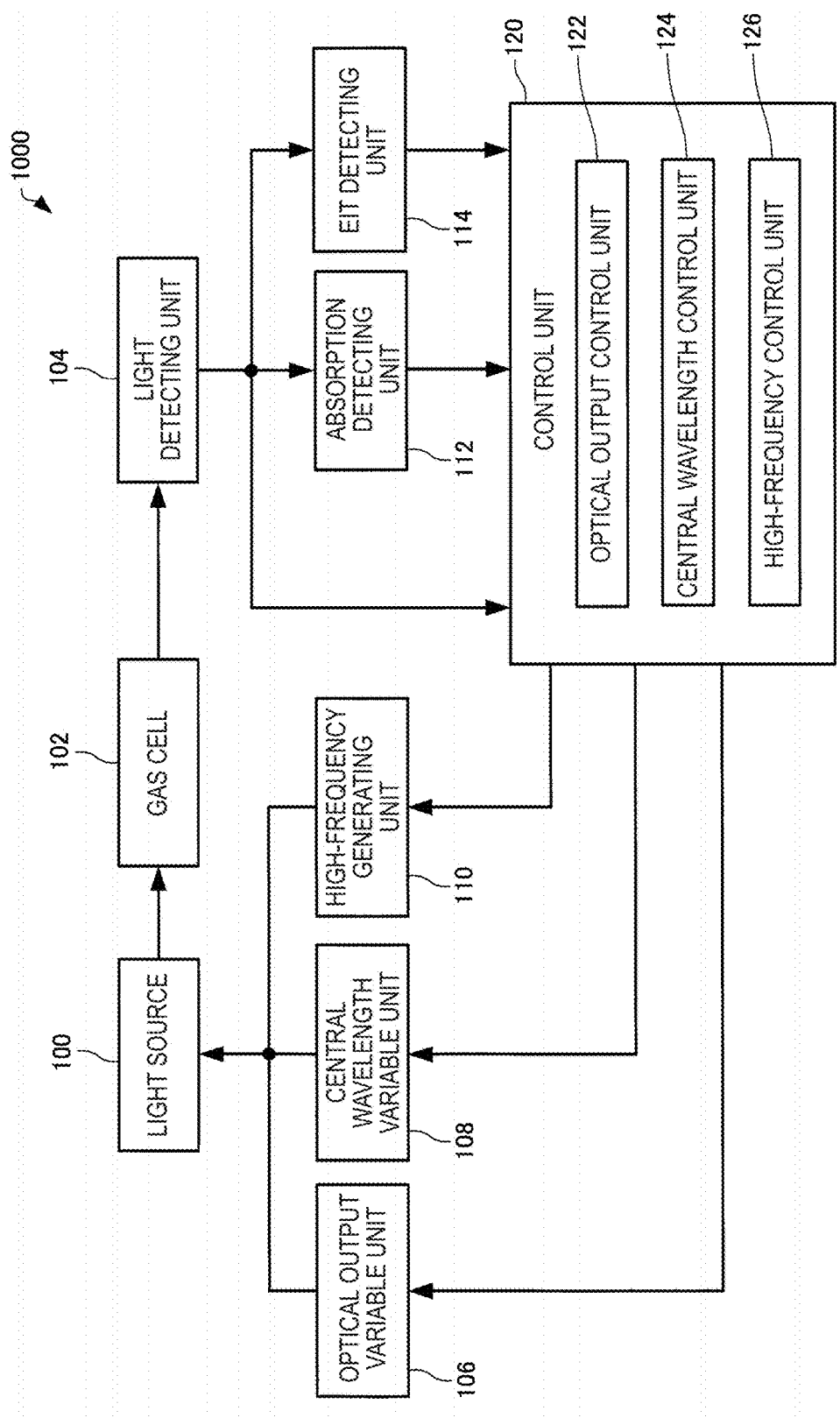
FIG. 1 is a functional block diagram of an atomic oscillator according to the present embodiment.

First, an atomic oscillator according to the present embodiment will be described, referring to drawings. FIG. 1 is a functional block diagram of an atomic oscillator 1000 according to the present embodiment.

The atomic oscillator 1000, as illustrated in FIG. 1, includes the light source 100, a gas cell 102, light detecting means (light detecting unit) 104, a optical output variable unit 106, a central wavelength variable unit 108, a high-frequency generating unit 110, an absorption detecting unit 112, an EIT detecting unit 114, and a control unit 120. The control unit 120 has an optical output control unit 122, a central wavelength control unit 124, and a high-frequency control unit 126. The atomic oscillator 1000 causes an EIT phenomenon in alkali metal atoms using a resonance light pair (first light and second light) having two different frequency components.

The light source 100 generates the first light and the second light having mutually different frequencies, and irradiates alkali metal atoms sealed in the gas cell 102 with the first light and the second light. The detailed configuration of the light source 100 will be described below.

Figure 2:
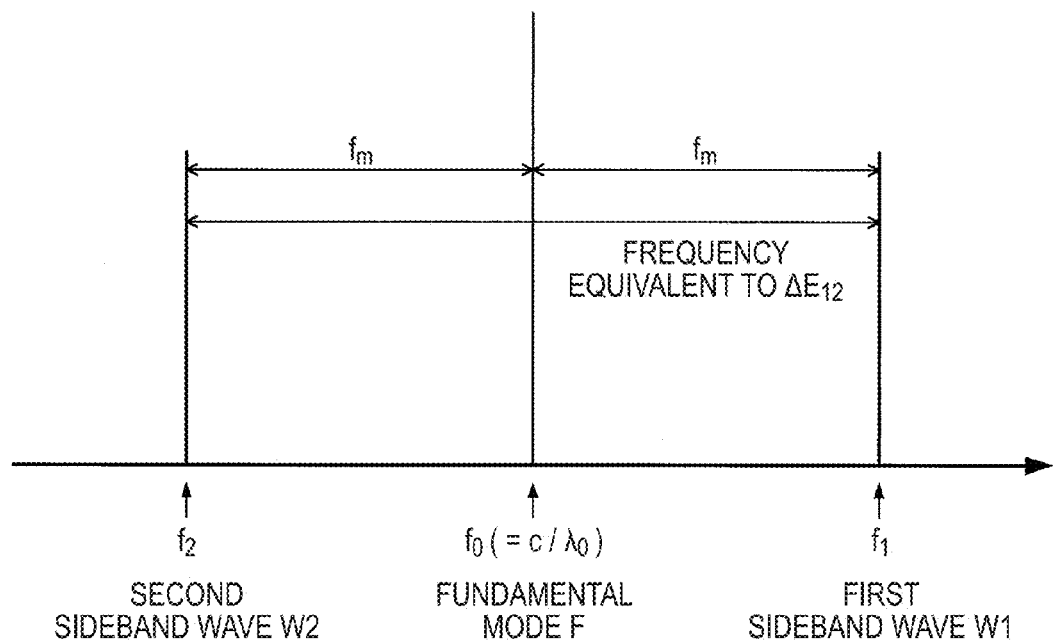
FIG. 2 is a view illustrating a frequency spectrum of resonance light.
Figure 3:
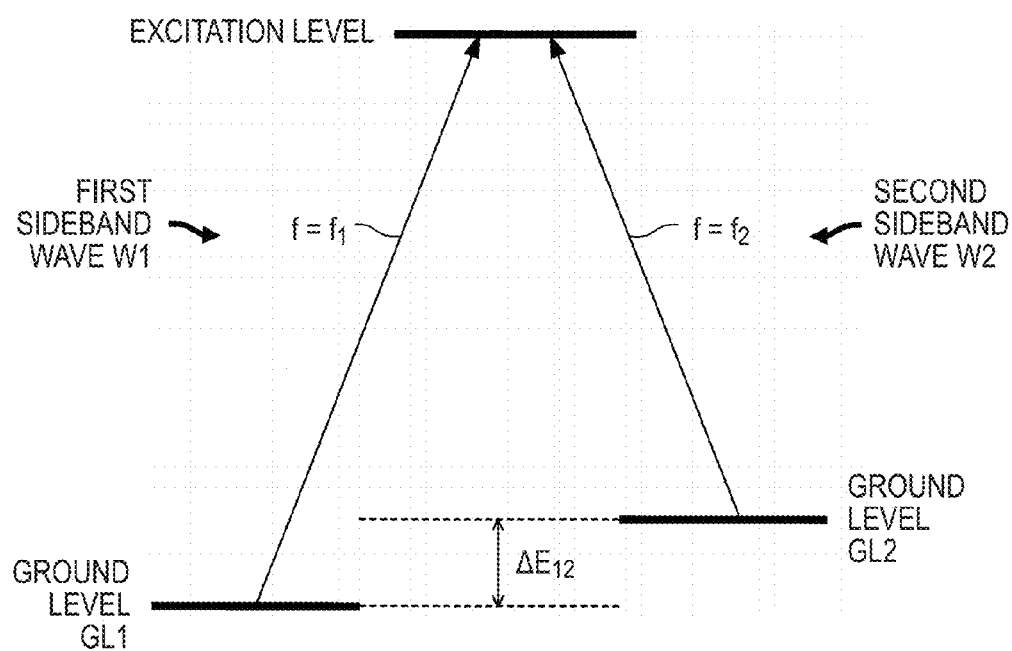
FIG. 3 is a view illustrating a relationship between a V-type three-level model of an alkali metal atom and a first sideband wave and a second sideband wave.

Here, FIG. 2 is a view illustrating a frequency spectrum of resonance light. FIG. 3 is a view illustrating a relationship between a Λ-type three-level model of alkali metal atoms, and a first sideband wave (first light) W1 and a second sideband wave (second light) W2. The light L exited from the light source 100 includes a fundamental mode F having a central frequency $f_0$ ($=c/\lambda_0$: c is the speed of light, and X0 is the central wavelength of laser light), the first sideband wave W1 having a frequency $f_1$ in an upper sideband with respect to the central frequency $f_0$, and the second sideband wave W2 having a frequency $f_2$ in a lower sideband with respect to the central frequency $f_0$, which are illustrated in FIG. 2. The frequency $f_1$ of the first sideband wave W1 is $f_1=f_0+fm$, and the frequency $f_2$ of the second sideband wave W2 is $f_2=f_0-fm$.

As illustrated in FIG. 3, a frequency difference between the frequency $f_1$ of the first sideband wave W1 and the frequency $f_2$ of the second sideband wave W2 coincides with a frequency equivalent to an energy difference $\Delta E_{12}$ of a ground level GL1 and a ground level GL2 of the alkali metal atoms. Therefore, the alkali metal atoms cause an EIT phenomenon due to the first sideband wave W1 having the frequency $f_1$ and the second sideband wave W2 having the frequency $f_2$.

Here, the EIT phenomenon will be described. It is known that an interaction between alkali metal atoms and light can be explained with a Λ-type three-level system model. As illustrated in FIG. 3, the alkali metal atoms have two ground levels, and if the first sideband wave W1 having a wavelength (frequency $f_1$) equivalent to an energy difference between the ground level GL1 and an excitation level, or the second sideband wave W2 having a wavelength (frequency $f_2$) equivalent to an energy difference between the ground level GL2 and the excitation level radiates the alkali metal atoms respectively and independently, optical absorption is caused. On the contrary, as illustrated in FIG. 2 if the alkali metal atoms are simultaneously irradiated with the first sideband wave W1 and the second sideband wave W2 in which a frequency difference $f_1 - f_2$ exactly coincides with the frequency equivalent to the energy difference $\Delta E_{12}$ between the ground level GL1 and the ground level GL2, a superposition state of the two ground levels, that is, a quantum interference state is brought about. As a result, a transparency phenomenon (EIT phenomenon) in which excitation to the excitation level stops and the first sideband wave W1 and the second sideband wave W2 are transmitted through the alkali metal atoms. A high-precision oscillator can be built by using this EIT phenomenon and detecting and controlling a steep change in optical absorption behavior when the frequency difference $f_1-f_2$ between the first sideband wave W1 and the second sideband wave W2 deviates from the frequency equivalent to the energy difference $\Delta E_{12}$ between the ground level GL1 and the ground level GL2.

The gas cell 102 encloses gaseous alkali metal atoms (sodium atoms, rubidium atoms, cesium atoms, or the like) in a container. The cesium atoms are heated to, for example, about 80° C., and is turned into gas. If this gas cell 102 is irradiated with two light waves (the first light and the second light) having a frequency (wavelength) equivalent to an energy difference between two ground levels of the alkali metal atoms, the alkali metal atoms cause the EIT phenomenon. For example, if the alkali metal atoms are cesium atoms, a frequency equivalent to the energy difference between the ground level GL1 and the ground level GL2 in line D1 is 9.19263 . . . GHz. Thus, if two light waves of which the frequency difference is 9.19263 . . . GHz, the EIT phenomenon is caused.

The light detecting unit 104 detects the quantity (intensity) of light of light (transmitted through the alkali metal atoms sealed in the gas cell 102) transmitted through the gas cell 102. The light detecting unit 104 outputs a detection signal according to the quantity of the light transmitted through the alkali metal atoms. As the light detecting unit 104, for example, a photodiode is used.

On the basis of the signal from the optical output control unit 122, the optical output variable unit 106 applies a voltage between the electrodes 60 and 62 (refer to FIG. 5 to be described below) of the light source 100, and changes the optical output (quantity of light) of the light source 100. The optical output variable unit 106 may be configured to include the power source 4 (refer to FIG. 8 to be described below) that applies a voltage between the electrodes 60 and 62.

On the basis of a signal from the central wavelength control unit 124, the central wavelength variable unit 108 applies a voltage between the electrodes 30 and 32 (refer to FIG. 5) of the light source 100, allows a current to flow into the active layer 22, and changes the central wavelength of the light L exited from the light source 100. Accordingly, the central wavelength of a resonance light pair (the first light and the second light) included in the light L can be changed. The central wavelength variable unit 108 may be configured to include the power source 2 (refer to FIG. 8) that applies a voltage between electrodes 30 and 32.

On the basis of a signal from the high-frequency control unit 126, the high-frequency generating unit 110 supplies a high-frequency signal between the electrodes 30 and 32 of the light source 100 to generate a resonance light pair. The high-frequency generating unit 110 may be realized by a dedicated circuit.

The absorption detecting unit 112, for example, detects a minimum value (the bottom of absorption) of the signal intensity of a detection signal output from the light detecting unit 104 when the central wavelength of the light L has been changed. The absorption detecting unit 112 may be realized by a dedicated circuit.

The EIT detecting unit 114 synchronously detect the detection signal output from the light detecting unit 104, and detects the EIT phenomenon. The EIT detecting unit 114 may be realized by a dedicated circuit.

On the basis of an average (DC component) of the quantity of light of the detection signal output from the light detecting unit 104, the optical output control unit 122 controls the optical output variable unit 106, thereby controlling a voltage to be applied to the electrical field absorption layer 59 (refer to Fig, 5) of the light source 100 (applied to the quantum well layer 52) so as to change the quantity of absorbed light in the electrical field absorption layer 59 (in the quantum well layer 52). Accordingly, the optical output control unit 122 can change the optical output (the quantity of light) of the light source 100. The optical output control unit 122 may control the optical output variable unit 106, on the basis of a moving average of the quantity of light of the detection signal. The optical output control unit 122 controls a voltage to be applied to the electrical field absorption layer 59 such that the optical output exited from the light source 100 becomes constant (for example, the DC component of the detection signal output from the light detecting unit 104 becomes constant). The optical output control unit 122 may be configured to include an auto power control (APC) circuit.

On the basis of a signal from the absorption detecting unit 112, the central wavelength control unit 124 controls the central wavelength variable unit 108, thereby controlling a current to be flowed into the active layer 22 (refer to FIG. 5) of the light source 100 so as to change the optical output (the quantity of light) and the wavelength (central wavelength) of the light L exited from the light source 100.

The high-frequency control unit 126 inputs a signal to generate a high-frequency signal, to the high-frequency generating unit 110, on the basis of a signal from the EIT detecting unit 114.

It should be noted that the control unit 120 may be configured to be realized by a dedicated circuit so as to perform the above control. Additionally, the control unit 120 may be configured to function as, for example, a computer by a central processing unit (CPU) executing a control program stored in a storage, such as a read only memory (ROM) or a random access memory (RAM), so as to perform the above control.

Next, the operation of the atomic oscillator 1000 will be described. First, the initial operation when starting the atomic oscillator 1000 in a stopped state will be described.

The high-frequency control unit 126 inputs a signal to the high-frequency generating unit 110, and inputs a high-frequency signal from the high-frequency generating unit 110 to the light source 100. In this case, the frequency of the high-frequency signal is slightly shifted such that the EIT phenomenon does not occur. For example, in a case where cesium is used as the alkali metal atoms of the gas cell 102, the frequency is shifted from the value of 4.596 . . . GHz.

Next, the central wavelength control unit 124 controls the central wavelength variable unit 108 to sweep the central wavelength of the light L. In this case, since the frequency of the high-frequency signal is set such that the EIT phenomenon does not occur, the EIT phenomenon does not occur. The absorption detecting unit 112 detects the minimum value (the bottom of absorption) of the intensity of a detection signal to be output in the light detecting unit 104 when the central wavelength of the light L has been swept. The absorption detecting unit 112, for example, uses a point where a change in intensity of a detection signal with respect to the central wavelength of the light L, as the bottom of absorption.

If the absorption detecting unit 112 detects the bottom of absorption, the central wavelength control unit 124 controls the central wavelength variable unit 108 to fix (lock) the central wavelength. That is, the central wavelength control unit 124 fixes the central wavelength of the light L to a wavelength equivalent to the bottom of absorption.

Next, the optical output control unit 122 controls the optical output variable unit 106 to change the optical output of the light source 100, on the basis of the DC component of the detection signal output from the light detecting unit 104. Specifically, the optical output control unit 122 changes the optical output of the light source 100 such that the DC component of the detection signal has a predetermined value.

Next, the high-frequency control unit 126 controls the high-frequency generating unit 110 to match the frequency of the high-frequency signal with a frequency at which the EIT phenomenon occurs. Thereafter, the high-frequency control unit proceeds to a loop operation, and an EIT signal is detected by the EIT detecting unit 114.

Next, the loop operation of the atomic oscillator 1000 will be described.

The EIT detecting unit 114 synchronously detects the detection signal output from the light detecting unit 104, and the high-frequency control unit 126 performs control such that the frequency of the high-frequency signal generated from the high-frequency generating unit 110 becomes a frequency equivalent to half of $\Delta E_{12}$ of the alkali metal atoms in the gas cell 102, on the basis of the signal input from the EIT detecting unit 114.

The absorption detecting unit 112 synchronously detects the detection signal output from the light detecting unit 104, and the central wavelength control unit 124 controls the central wavelength variable unit 108 such that the central wavelength of the light L becomes a wavelength equivalent to the minimum value (the bottom of absorption) of the intensity of a detection signal to be output in the light detecting unit 104, on the basis of the signal input from the absorption detecting unit 112.

The optical output control unit 122 controls the optical output variable unit 106 on the basis of the DC component of the detection signal output from the light detecting unit 104. Specifically, in a case where the DC component of the detection signal becomes smaller than a predetermined value, the optical output control unit 122 controls the optical output variable unit 106 such that the DC component of the detection signal has a predetermined value. Even if the central wavelength of the light L deviates from the wavelength equivalent to the bottom of absorption through the control of the optical output control unit 122, the central wavelength of the light L can be matched with the wavelength equivalent to the bottom of absorption through the control of the central wavelength control unit 124. Moreover, even if the DC component of the detection signal deviates from the predetermined value through the control of the central wavelength control unit 124, the DC component of the detection signal can be returned to the predetermined value through the control of the optical output control unit 122.

In the atomic oscillator 1000, control may be performed such that the temperature (driving temperature) of the light source 100 becomes constant.

1.2. Light Source

Figure 4:
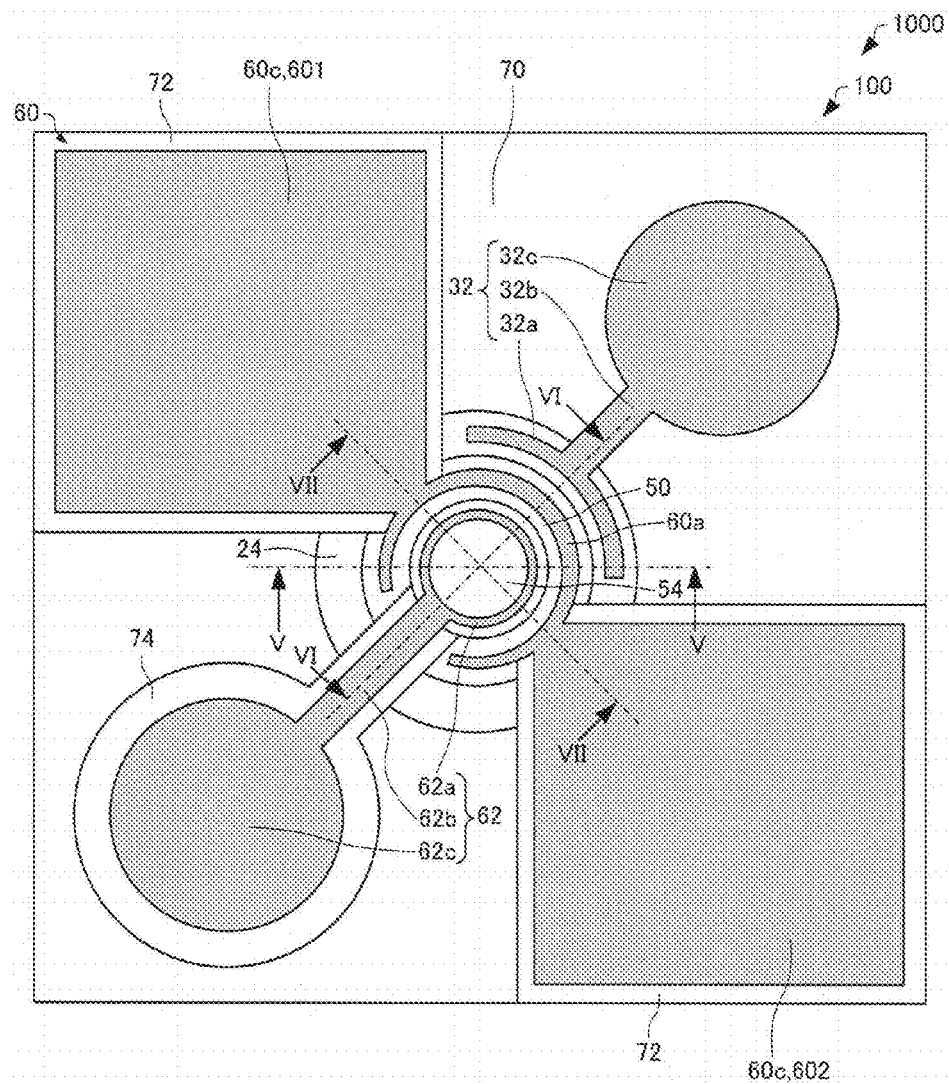
FIG. 4 is a plan view schematically illustrating a light source of the atomic oscillator according to the present embodiment.
Figure 5:
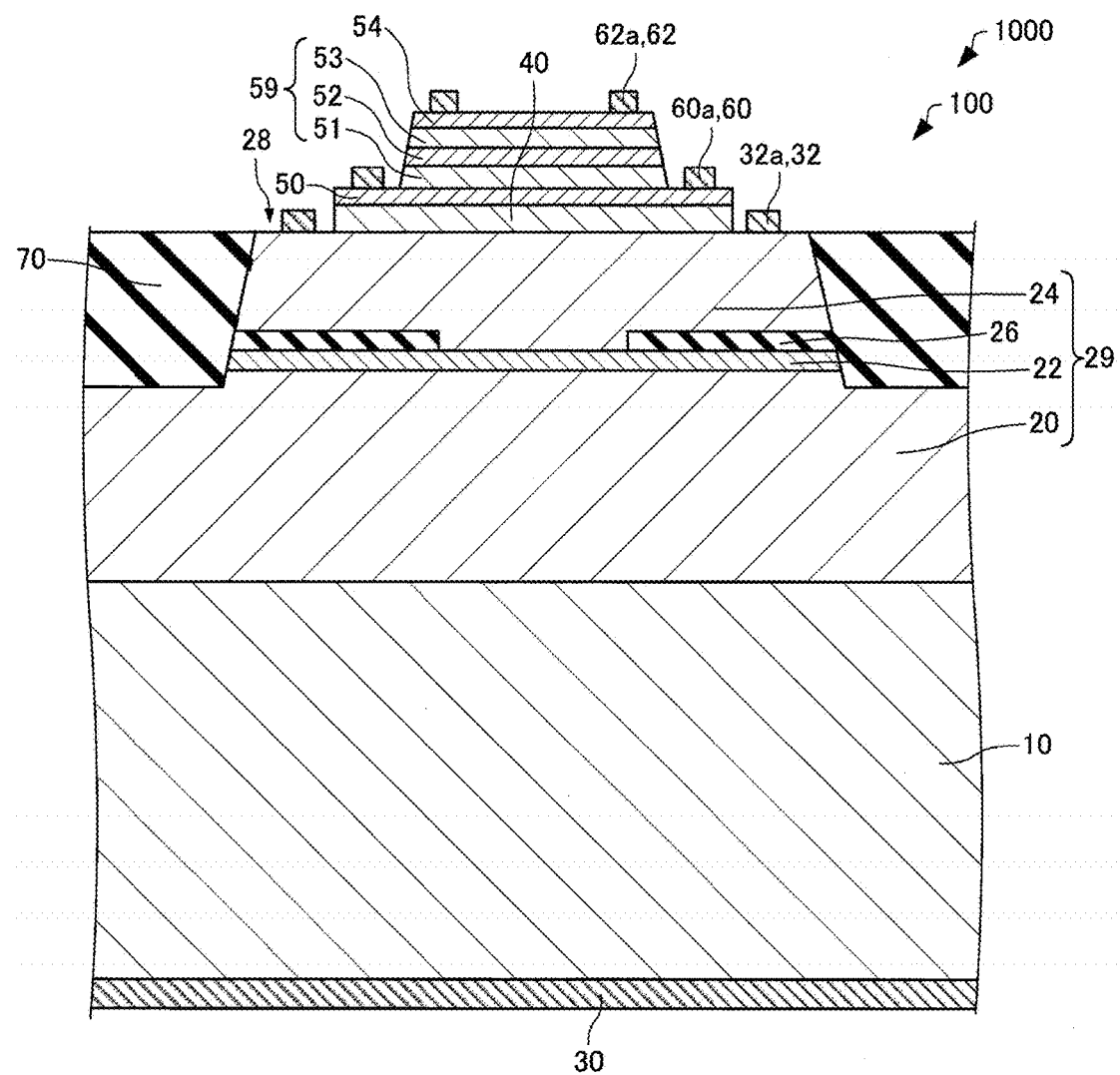
FIG. 5 is a sectional view schematically illustrating the light source of the atomic oscillator according to the present embodiment.
Figure 6:
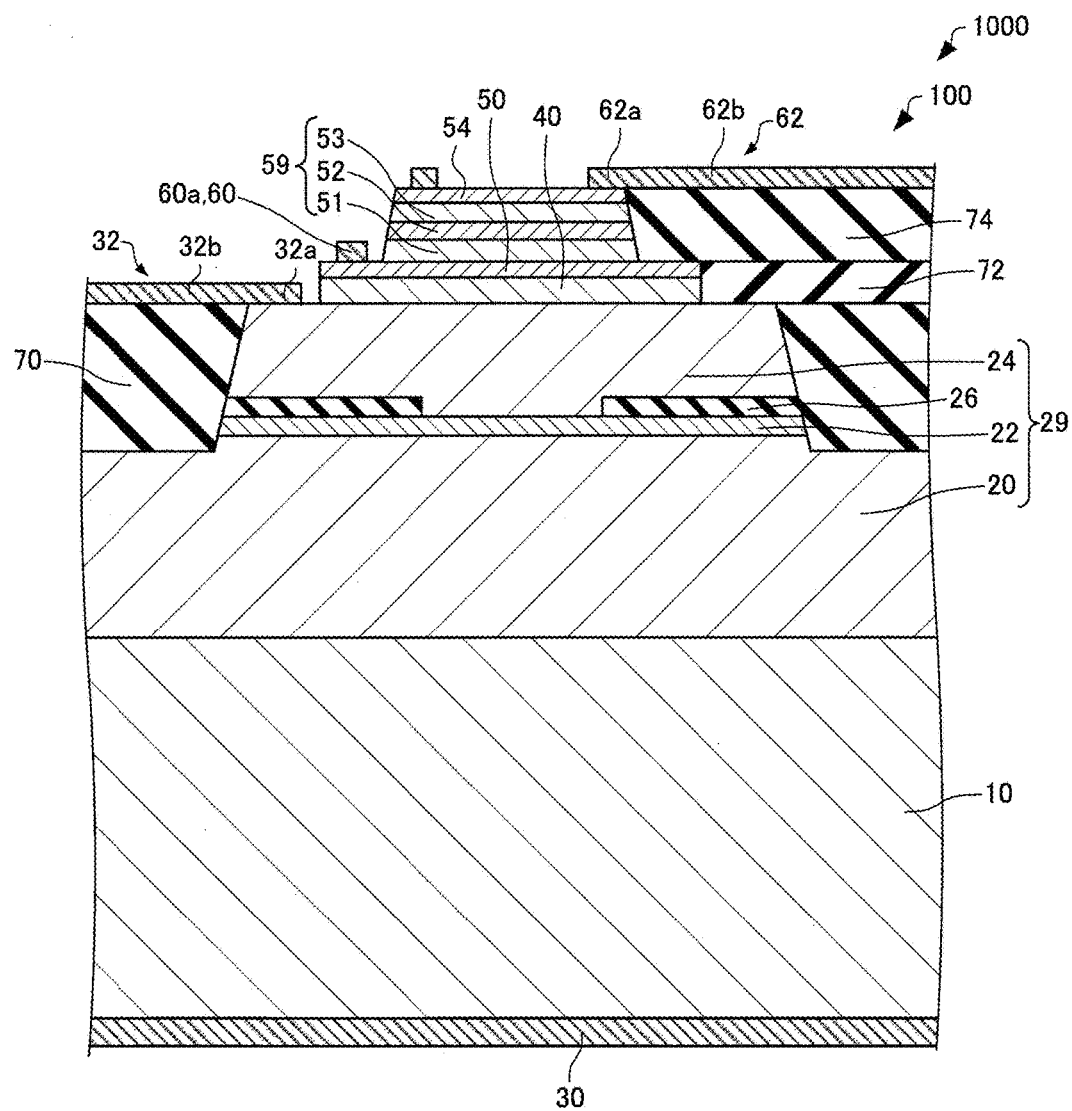
FIG. 6 is a sectional view schematically illustrating the light source of the atomic oscillator according to the present embodiment.
Figure 7:
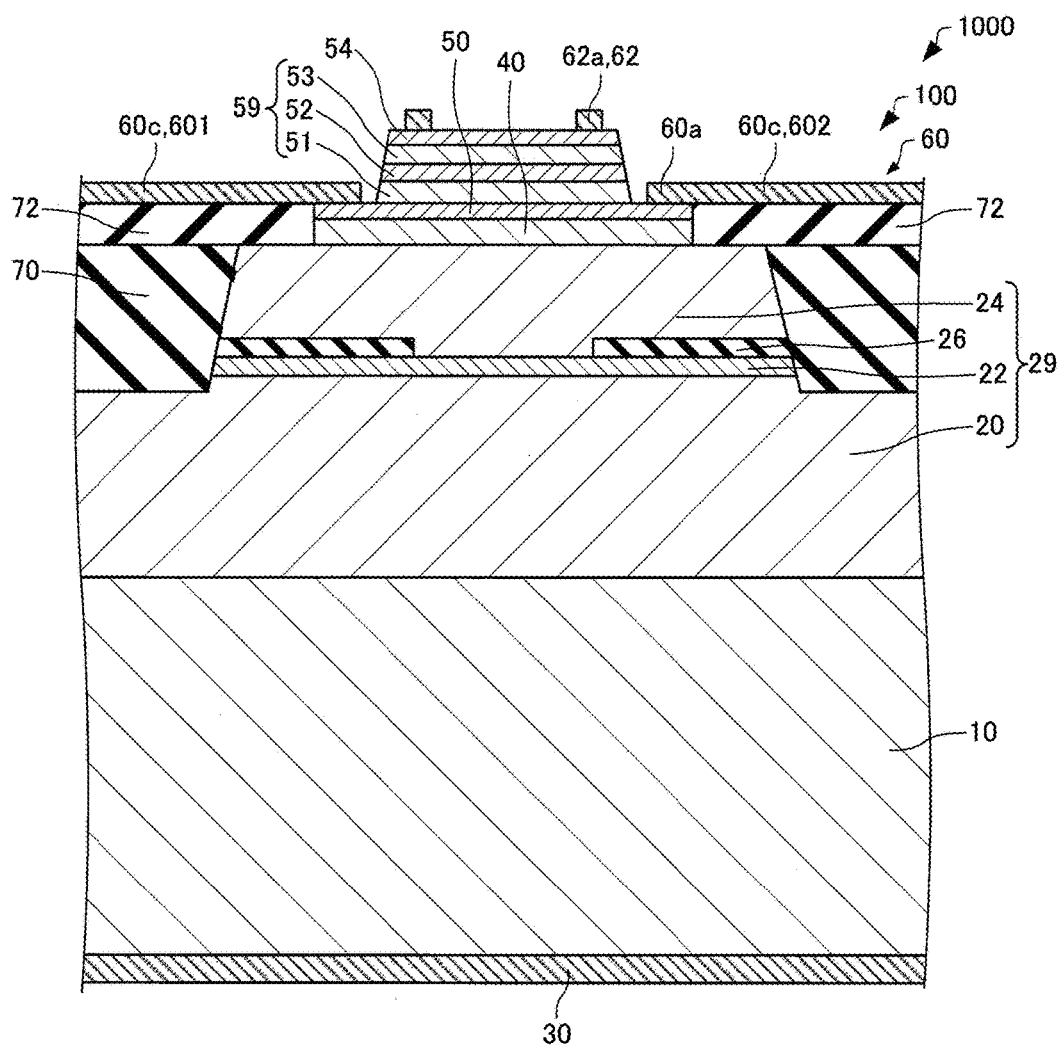
FIG. 7 is a sectional view schematically illustrating the light source of the atomic oscillator according to the present embodiment.
Figure 8:
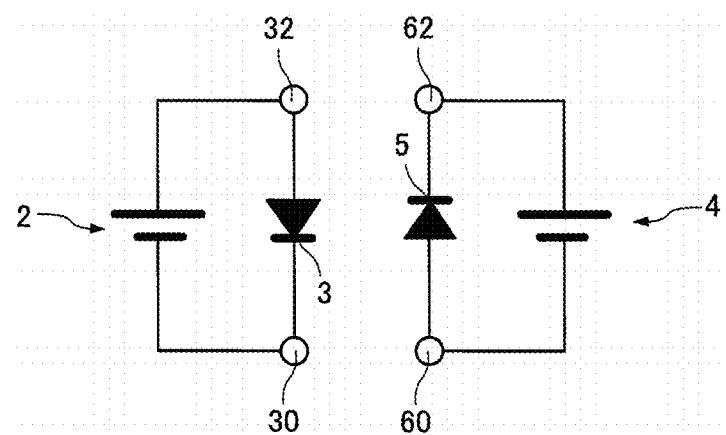
FIG. 8 is a circuit diagram for explaining the light source of the atomic oscillator according to the present embodiment.

First, the light source 100 of the atomic oscillator 1000 according to the present embodiment will be described, referring to drawings. FIG. 4 is a plan view schematically illustrating a light source 100 according to the present embodiment. FIG. 5 is a sectional view, taken along line V-V of FIG. 4, schematically illustrating the light source 100 according to the present embodiment. FIG. 6 is a sectional view, taken along line VI-VI of FIG. 4, schematically illustrating the light source 100 according to the present embodiment. FIG. 7 is a sectional view, taken along line VII-VII of FIG. 4, schematically illustrating the light source 100 according to the present embodiment. FIG. 8 is a circuit diagram for explaining the light source 100 according to the present embodiment.

The light source 100, as illustrated in FIGS. 4 to 7, includes a substrate 10, a first reflective layer 20, an active layer 22, a second reflective layer 24, a current constriction layer 26, a first electrode 30, a second electrode 32, a heat diffusion layer 40, a first contact layer 50, a first semiconductor layer 51, a quantum well layer 52, a second semiconductor layer 53, a second contact layer 54, a third electrode 60, a fourth electrode 62, and insulating layers 70, 72, and 74.

The substrate 10 is, for example, a first conductivity type (for example, n-type) GaAs substrate.

The first reflective layer 20 is provided on the substrate 10. The first reflective layer 20 is a first conductivity type semiconductor layer. The first reflective layer 20 is a distribution Bragg reflector (DBR) mirror in which a high refractive-index layer and a low refractive-index layer having a lower refractive index than the high refractive-index layer are alternately laminated. The high refractive-index layer is, for example, an n-type $Al_{0.12}Ga_{0.88}As$ layer. The low refractive-index layer is, for example, an n-type $Al_{0.9}Ga_{0.1}As$ layer. The number (the number of pairs) of lamination of the high refractive-index layer and the low refractive-index layer is, for example, 10 pairs or more to 50 pairs or less, and specifically, 40.5 pairs.

The active layer 22 is provided on the first reflective layer 20. The active layer 22 has, for example, a multiplex quantum well (MQW) structure in which quantum well structures constituted of an i-type $In_{0.06}Ga_{0.94}As$ layer and an i-type $Al_{0.3}Ga_{0.7}As$ layer are superimposed on each other in three layers.

The second reflective layer 24 is provided on the active layer 22. The second reflective layer is a second conductivity type (for example, p-type) semiconductor layer. The second reflective layer 24 is a distribution Bragg reflector (DBR) mirror in which a high refractive-index layer and a low refractive-index layer having a lower refractive index than the high refractive-index layer are alternately laminated. The high refractive-index layer is, for example, a p-type $Al_{0.12}Ga_{0.88}As$ layer. The low refractive-index layer is, for example, a p-type $Al_{0.9}Ga_{0.1}As$ layer. The number (the number of pairs) of lamination of the high refractive-index layer and the low refractive-index layer is, for example, 3 pairs or more to 40 pairs or less, and specifically, 20 pairs.

The second reflective layer 24, the active layer 22, and the first reflective layer 20 constitute an optical oscillation layer 29. The optical oscillation layer 29 is a laminated body in which the first reflective layer 20, the active layer 22, and the second reflective layer 24 are laminated in this order. The optical oscillation layer 29 constitutes a perpendicular resonator type pin diode. As illustrated in FIG. 8, if a forward voltage of the pin diode 3 is applied between the electrodes 30 and 32 electrically connected to the power source 2, the re-coupling of an electron and a positive hole occurs in the active layer 22, and light emission occurs. The light generated in the active layer 22 is bounced back and forth (multi-reflected) between the first reflective layer 20 and the second reflective layer 24, induced emission occurs in that case, and intensity is amplified. Then, if optical gain exceeds optical loss, laser oscillation occurs, and laser light is exited in a vertical direction (in a laminated direction of the active layer 22 and the first reflective layer 20) from an upper surface of the second contact layer 54. The wavelength of this laser light is, for example, 800 nm or more to 950 nm or less, and specifically, 852 nm or 895 nm.

The current constriction layer 26 is provided between the first reflective layer 20 and the second reflective layer 24. In an example illustrated in FIG. 5, the current constriction layer 26 is provided on the active layer 22. The current constriction layer 26 is an insulating layer in which an opening is formed, and this opening is provided with the second reflective layer 24. A planar shape (a shape as seen from the laminated direction of the active layer 22 and the first reflective layer 20) of the current constriction layer 26 is ring-shaped. The current constriction layer 26 can prevent a current to be flowed into a perpendicular resonator by the electrodes 30 and 32 from widening in a planar direction (a direction orthogonal to the laminated direction of the active layer 22 and the first reflective layer 20).

The current constriction layer 26, the second reflective layer 24, the active layer 22, and the first reflective layer 20 constitute a columnar section 28. A planar shape of the columnar section 28 is, for example, circular.

The first electrode 30 is provided under the substrate 10. The first electrode 30 is provided, for example, on a lower surface of a layer (a substrate 10 in the example illustrated in FIG. 5) that comes in ohmic contact with the first electrode 30. The first electrode 30 is electrically connected to the first reflective layer 20. As the first electrode 30, for example, an electrode in which a Cr layer, an AuGe layer, an Ni layer, and an Au layer are laminated in this order from the substrate 10 side is used. The first electrode 30 is one electrode to flow a current into the active layer 22.

The second electrode 32 is disposed on the second reflective layer 24. The second electrode 32 is electrically connected to the second reflective layer 24. As the second electrode 32, for example, an electrode in which a Cr layer, a Pt layer, a Ti layer, a Pt layer, and an Au layer are laminated in this order from the second reflective layer 24 side is used. The second electrode 32 is the other electrode to flow a current into the active layer 22.

The second electrode 32, as illustrated in FIG. 4, has a contacting part 32a, a lead-out part 32b, and a pad part 32c. The contacting part 32a is in contact with the second reflective layer 24. In the example illustrated in FIG. 4, a planar shape of the contacting part 32a is a shape obtained by cutting off a portion of a ring shape. A planar shape of the lead-out part 32b is, for example, linear. The lead-out part 32b connects the contacting part 32a and the pad part 32c together. The lead-out part 32b and the pad part 32c are provided on an insulating layer 70. The pad part 32c is connected to external wiring or the like serving as an electrode pad. In the illustrated example, a planar shape of the pad part 32c is circular. The insulating layer 70 is provided so as to surround the columnar section 28 in contact with, for example, a side surface of the columnar section 28. The insulating layer 70 is, for example, a polyimide layer or a silicon oxide layer.

The second electrode 32, the second reflective layer 24, the active layer 22, the first reflective layer 20, and the first electrode 30 constitute a vertical cavity surface emitting laser (VCSEL).

The heat diffusion layer 40 is disposed on the second reflective layer 24. The heat diffusion layer 40 is disposed between the second reflective layer 24 and the first contact layer 50 (between the optical oscillation layer 29 and an electrical field absorption layer 59). A planar shape of the heat diffusion layer 40 is, for example, circular. In the plan view (as seen in the laminated direction of the active layer and the first reflective layer 20), the area of heat diffusion layer 40 is smaller than the area of an upper surface of the second reflective layer 24, and heat diffusion layer 40 is provided inside an outer edge of the second reflective layer 24. The thermal conductivity of the heat diffusion layer 40 is higher than the thermal conductivity of the second reflective layer 24. Specifically, the thermal conductivity of the heat diffusion layer 40 is higher than the thermal conductivity of the high refractive-index layer that constitutes the second reflective layer 24, and is lower than the thermal conductivity of the low refractive-index layer that constitutes the second reflective layer 24. The heat diffusion layer 40 is, for example, an i-type AlAs layer, or an i-type GaAs layer. For example, the thermal conductivity of i-type GaAs is 0.55 W/(cm·K).

The first contact layer 50 is disposed on the heat diffusion layer 40. The first contact layer 50 is provided between the heat diffusion layer 40 and the first semiconductor layer 51. In the example illustrated in FIG. 4, a planar shape of the first contact layer 50 is circular. In the plan view, the area of the first contact layer 50 and the area of the heat diffusion layer 40 are, for example, the same as each other. The first contact layer 50 is, for example, a p-type GaAs layer.

The first semiconductor layer 51 is provided on the first contact layer 50. A planar shape of the first semiconductor layer 51 is, for example, circular. In the plan view, the area of the first semiconductor layer 51 is smaller than the area of an upper surface of the first contact layer 50, and the first semiconductor layer 51 is provided inside an outer edge of the first contact layer 50. The first semiconductor layer 51 is, for example, a p-type $Al_{0.3}Ga_{0.7}As$ layer.

The quantum well layer 52 is provided on the first semiconductor layer 51. The quantum well layer 52 has a multiplex quantum well (MQW) structure in which three quantum well structures constituted of an i-type GaAs well layer and an i-type $Al_{0.3}Ga_{0.7}As$ barrier layer are superimposed on each other.

The second semiconductor layer 53 is provided on the quantum well layer 52. The second semiconductor layer 53 is, for example, an n-type $Al_{0.3}Ga_{0.7}As$ layer. The semiconductor layers 51 and 53 are layers that have a greater band gap and a smaller refractive index than the quantum well layer 52.

The second semiconductor layer 53, the quantum well layer 52, and the first semiconductor layer 51 constitute the electrical field absorption layer 59. The electrical field absorption layer 59 is a laminated body in which the first semiconductor layer 51, the quantum well layer 52, and the second semiconductor layer 53 are laminated in this order. The electrical field absorption layer 59 constitutes the pin diode (pin photodiode). As illustrated in FIG. 8, if a backward voltage of the pin diode 5 is applied between the electrodes 60 and 62 electrically connected to a power source 4, light can be absorbed in the quantum well layer 52. Accordingly, light (laser light generated in a vertical cavity surface emitting laser) generated in the optical oscillation layer 29 can be absorbed. The quantity of absorption of light in the quantum well layer 52 can be adjusted depending on the magnitude of a voltage to be applied to the electrical field absorption layer 59.

It should be noted that the pin photodiode configured to include the electrical field absorption layer 59 may take out or may not take out a photocurrent caused by an electron and a positive hole that are excited by absorbing light in the quantum well layer 52, to an external circuit as a signal.

Here, if a voltage is applied to the electrical field absorption layer 59, the absorption wavelength (absorption peak wavelength) of the electrical field absorption layer 59 shifts to a longer wavelength side due to the quantum confined Stark effect compared to the case where no voltage is applied. Therefore, in a state where no voltage is applied to the electrical field absorption layer 59, the absorption peak wavelength in the electrical field absorption layer 59 is set closer to a shorter wavelength side than the oscillation wavelength in the optical oscillation layer 29 (vertical cavity surface emitting laser). Then, by applying a voltage to the electrical field absorption layer 59, the absorption peak wavelength of the electrical field absorption layer 59 is shifted, and the light generated in the optical oscillation layer 29 is absorbed.

For example, in a case where the oscillation wavelength in the optical oscillation layer 29 is 852 nm, the absorption peak wavelength (quantum well layer 52) of the electrical field absorption layer 59 reaches 800 nm in a state where no voltage is applied. In this case, as the quantum well layer 52, there is used quantum well layer having a multiplex quantum well (MQW) structure in which three quantum well structures constituted of a GaAs well layer with a thickness of 4 nm and an $Al_{0.3}Ga_{0.7}As$ barrier layer with a thickness of 10 nm are superimposed on each other.

The second contact layer 54 is provided on the second semiconductor layer 53. In the example illustrated in FIG. 4, a planar shape of the second contact layer 54 is circular. A material for the second contact layer 54 is, for example, a n-type GaAs layer.

The third electrode layer 60 is provided on the first contact layer 50. The third electrode 60 is provided on a surface where the first semiconductor layer 51 of the first contact layer 50 is disposed. The third electrode 60 is electrically connected to the first semiconductor layer 51. For example, the third electrode 60 comes in ohmic contact with the first contact layer 50. A material for the third electrode 60 is, for example, the same as a material for the second electrode 32. The third electrode 60 is one electrode for applying a voltage to the electrical field absorption layer 59.

The third electrode 60, as illustrated in FIG. 4, has a contacting part 60a and a pad part 60c. The contacting part 60a is in contact with the first contact layer 50. In the example illustrated in FIG. 4, the contacting part 60a has a shape obtained by cutting off a part of a ring shape in the plan view, and is provided so as to surround the second contact layer 54.

The pad part 60c of the third electrode 60 is connected to, for example, the contacting part 60a. The pad part 60c has a first portion 601 and a second portion 602. In the plan view, the area of the first portion 601 is greater than the area of the pad part 32c of the second electrode 32 and the area of the pad part 62c of the fourth electrode 62. In the plan view, the area of the second portion 602 is greater than the area of the pad part 32c and the area of the pad part 62c. In an illustrated example, planar shapes of the first portion 601 and the second portion 602 are substantially quadrangular. In the plan view, the first portion 601 and the second portion 602 may be provided point-symmetrically with respect to the center of the second contact layer 54.

The pad part 60c of the third electrode 60 is provided on the insulating layer 72. The pad part 60c is connected to external wiring or the like serving as an electrode pad. The insulating layer 72, as illustrated in FIG. 7, is provided on the insulating layer 70 in contact with side surfaces of the heat diffusion layer 40 and the first contact layer 50. A material for the insulating layer 72 is, for example, the same as a material for the insulating layer 70.

The fourth electrode 62 is provided on the second contact layer 54. The fourth electrode 62 is electrically connected to the second semiconductor layer 53. For example, the fourth electrode 62 comes in ohmic contact with the second contact layer 54. A material for the fourth electrode 62 is, for example, the same as a material for the first electrode 30. The fourth electrode 62 is the other electrode for applying a voltage to the electrical field absorption layer 59.

The fourth electrode 62, as illustrated in FIG. 4, has a contacting part 62a, a lead-out part 62b, and a pad part 62c. The contacting part 62a is in contact with the second contact layer 54. In the example illustrated in FIG. 4, a planar shape of the contacting part 62a is ring-shaped. A planar shape of the lead-out part 62b is, for example, linear. The lead-out part 62b connects the contacting part 62a and the pad part 62c together. The lead-out part 62b and the pad part 62c are provided on an insulating layer 74. The pad part 62c is connected to external wiring or the like serving as an electrode pad. In the illustrated example, a planar shape of the pad part 62c is circular. The insulating layer 74, as illustrated in FIG. 6, is provided on the insulating layer 72 in contact with side surfaces of the electrical field absorption layer 59 and the second contact layer 54. A material for the insulating layer 74 is, for example, the same as a material for the insulating layer 70.

Although not illustrated, the insulating layer 72 may be provided so as to surround the heat diffusion layer 40 and the first contact layer 50, or the insulating layer 74 may be provided so as to surround the electrical field absorption layer 59 and the second contact layer 54.

Additionally, although the AlGaAs-based light source has been described above, for example, a GaInP-based, ZnSSe-based, InGaN-based, AlGaN-based, InGaAs-based, GaIn-NAs-based, or GaAsSb-based semiconductor material may be used for the light source, according to oscillation wavelength.

1. 3. Method for Manufacturing Light Source

Figure 9:
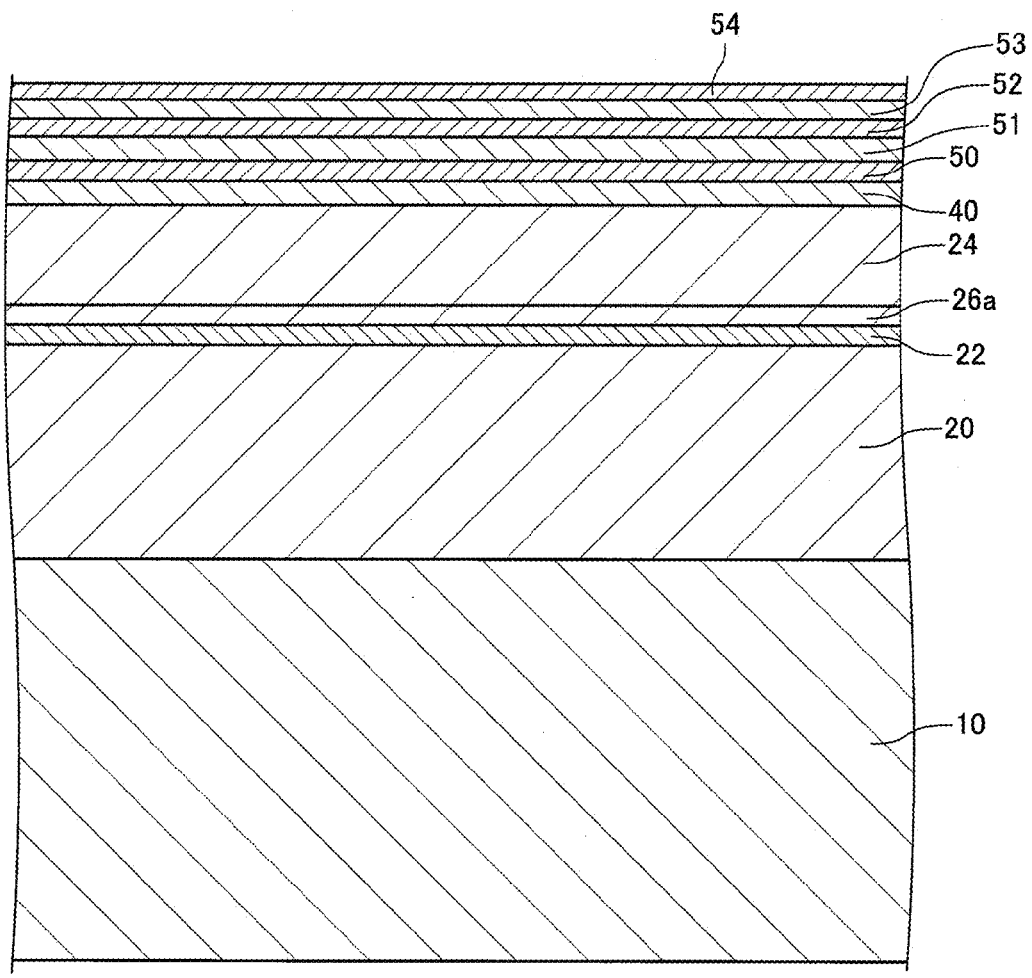
FIG. 9 is a sectional view schematically illustrating a process of manufacturing the light source of the atomic oscillator according to the present embodiment.
Figure 10:
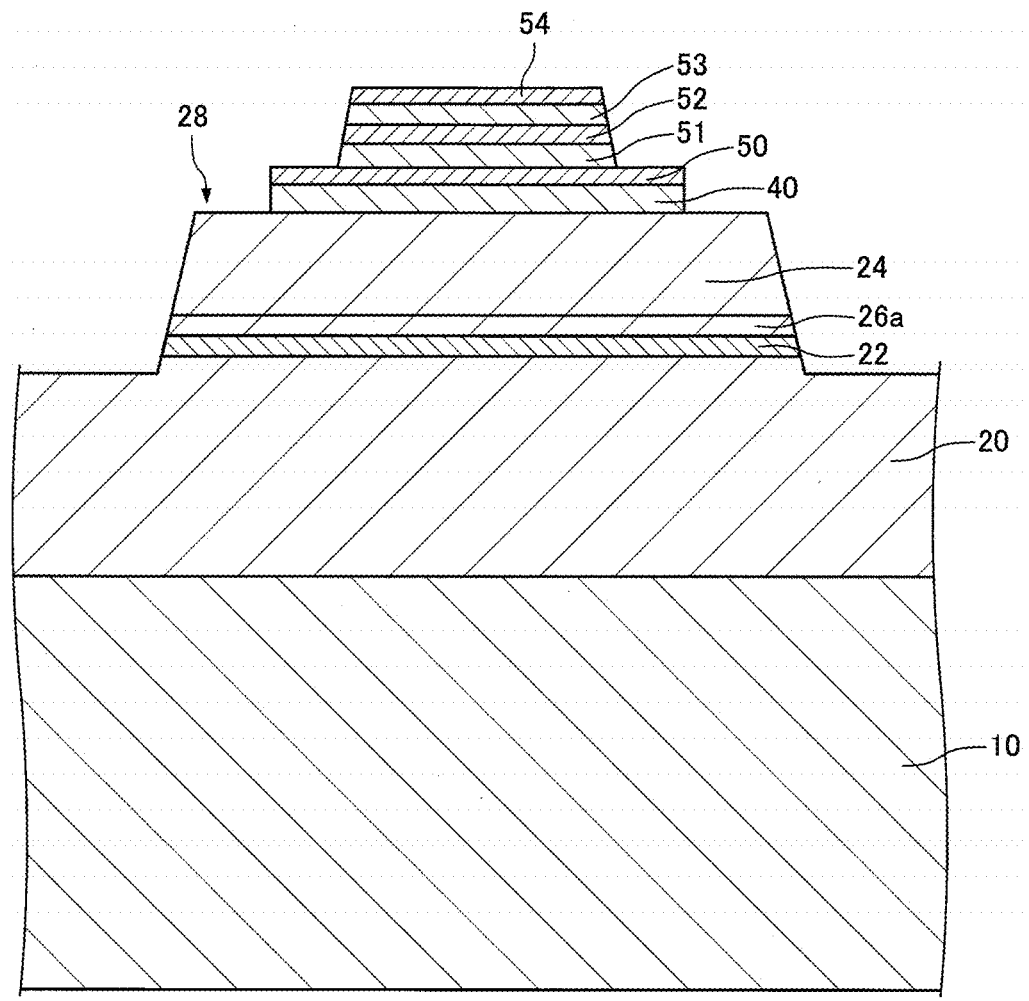
FIG. 10 is a sectional view schematically illustrating a process of manufacturing the light source of the atomic oscillator according to the present embodiment.
Figure 11:
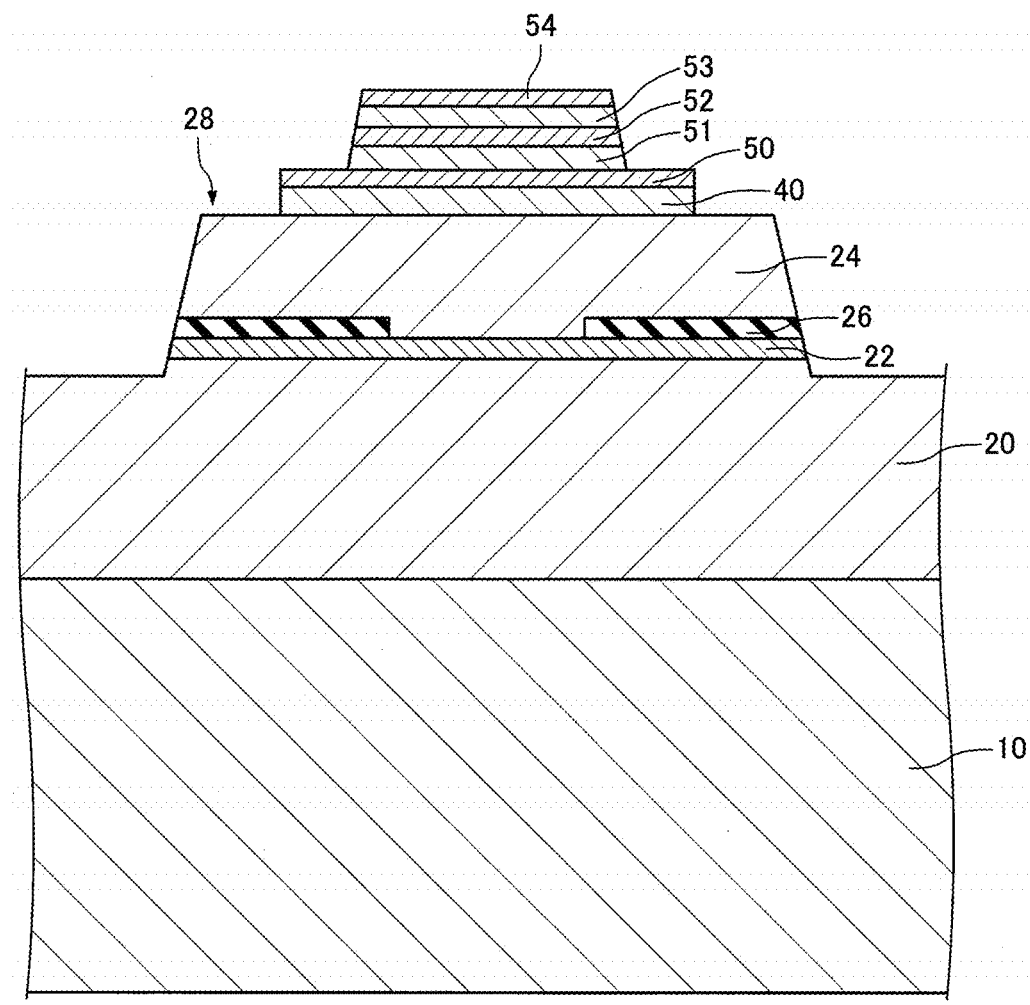
FIG. 11 is a sectional view schematically illustrating a process of manufacturing the light source of the atomic oscillator according to the present embodiment.

Next, a method for manufacturing the light source 100 according to the present embodiment will be described, referring to drawings. FIGS. 9 to 11 are sectional views schematically illustrating a process of manufacturing the light source 100 according to the present embodiment.

As illustrated in FIG. 9, the first reflective layer 20, the active layer 22, the oxidized layer 26a that is oxidized and partially serves as the current constriction layer 26, the second reflective layer 24, the heat diffusion layer 40, the first contact layer 50, the first semiconductor layer 51, the quantum well layer 52, the second semiconductor layer 53, and the second contact layer 54 are epitaxially grown in this order on the substrate 10. The epitaxial growing method includes, for example, a metal organic chemical vapor deposition (MOCVD) method, and a molecular beam epitaxy (MBE) method.

As illustrated in FIG. 10, the second contact layer 54, the second semiconductor layer 53, the quantum well layer 52, the first semiconductor layer 51, the first contact layer 50, the heat diffusion layer 40, the second reflective layer 24, the oxidized layer 26a, the active layer 22, and the first reflective layer 20 are patterned in a predetermined shape. Patterning is performed by, for example, photolithography or etching. The second contact layer 54, the second semiconductor layer 53, the quantum well layer 52, and the first semiconductor layer 51 may be patterned in the same process (for example, simultaneously). The first contact layer 50 and the heat diffusion layer 40 may be patterned in the same process. The second reflective layer 24, the oxidized layer 26a, the active layer 22, and the first reflective layer 20 may be patterned in the same process. The order of patterning the respective layers is not limited particularly. The columnar section 28 can be formed by the present process.

As illustrated in FIG. 11, the current constriction layer 26 is formed by oxidizing a portion of the oxidized layer 26a. The oxidized layer 26a is, for example, an $Al_xGa_{1-x}As$ ($x \geq 0.95$) layer. For example, by charging the substrate 10 in that each layer is formed in a steam atmosphere of about 400° C., the current constriction layer 26 is formed by oxidizing the oxidized layer 26a from a side surface. In the present process, a side surface of the heat diffusion layer 40 is covered with a resist (not illustrated) or the like such that the heat diffusion layer 40 is not oxidized.

As illustrated in FIG. 5, the insulating layer 70 is formed around the columnar section 28. In other words, in a plan view of the columnar section 28, the columnar section 28 is surrounded by the insulating layer 70. The insulating layer 70 is formed, for example, by film formation using a spin coating method or a CVD method, or by patterning. Patterning is performed by, for example, photolithography or etching.

As illustrated in FIGS. 6 and 7, the insulating layers 72 and 74 are formed on the insulating layer 70. The insulating layers 72 and 74 are formed, for example, by film formation using a spin coating method or a CVD method, or by patterning. Patterning is performed by, for example, photolithography or etching.

As illustrated in FIG. 5, the first electrode 30 is formed under the substrate 10, the second electrode 32 is formed on the second reflective layer 24, the third electrode 60 is formed on the first contact layer 50, and the fourth electrode 62 is formed on the second contact layer 54. The electrodes 30, 32, 60, and 62 are formed, for example, by the combination of a vacuum vapor deposition method, a lift-off method, and the like. It should be noted that the order in which the electrodes 30, 32, 60, and 62 are formed is not limited particularly.

The light source 100 can be manufactured by the above process.

The atomic oscillator 1000 has, for example, the following features.

In the atomic oscillator 1000, the light source 100 has the optical oscillation layer 29 in which the first reflective layer 20, the active layer 22, and the second reflective layer 24 are laminated in this order, and the electrical field absorption layer 59 in which the first semiconductor layer 51, the quantum well layer 52, and the second semiconductor layer 53 are laminated in this order. Therefore, in the atomic oscillator 1000, in a case where the central wavelength of light (light exited from the upper surface of the second contact layer 54) exited from the light source 100 is changed by changing the quantity of a current to be flowed into the active layer 22, even if the optical output (the quantity of light) of the light exited from the light source 100 deviates from a predetermined value, the optical output of the light exited from the light source 100 can be returned to the predetermined value by changing a voltage to be applied to the electrical field absorption layer 59 (to the quantum well layer 52).

Moreover, the light source 100 of the atomic oscillator 1000 has the heat diffusion layer 40 that is disposed between the optical oscillation layer 29 and the electrical field absorption layer 59, and has a higher thermal conductivity than that of the second reflective layer 24. Therefore, even if the electrical field absorption layer 59 (the quantum well layer 52) absorbs light to generate heat, this heat can be diffused to the outside via the heat diffusion layer 40, and this heat can be prevented from reaching the second reflective layer 24 or the active layer 22. Specifically, the heat generated in the electrical field absorption layer 59 is released to the outside via the first contact layer 50, the heat diffusion layer 40, the contacting part 60a, and the pad part 60c. Accordingly, in the atomic oscillator 1000, a temperature change in the light source 100 caused by the heat generated in the electrical field absorption layer 59 can be suppressed. Therefore, in the atomic oscillator 1000, the central wavelength of the light source 100 can be prevented from fluctuating with temperature, and the output wavelength and the optical output of the light source 100 can be individually (independently) controlled depending on the quantity of an inflow current to the active layer 22, and a voltage applied to the electrical field absorption layer 59. In the atomic oscillator 1000, for example, in order to make the central wavelength of the light source 100 constant, it is necessary to control the driving temperature of the light source 100 in units of tens of mK, and the control of temperature can be made easy by providing the heat diffusion layer 40.

Moreover, even in a case where the light source is driven with the quantity of a current to be flowed into the active layer being constant and the driving temperature of the light source being constant, the output wavelength and the optical output of the light source may vary in the long term. Even in this case, in the atomic oscillator 1000, the output wavelength and the optical output of the light source 100 can be individually controlled by the light source 100, and the long-term stability of the atomic oscillator 1000 can be improved.

In the light source 100 of the atomic oscillator 1000, the heat diffusion layer 40 is an i-type AlAs layer or an i-type GaAs layer. Therefore, the heat diffusion layer 40 can be formed in a series of processes (for example, in the same MOCVD apparatus) together with the optical oscillation layer 29 and the electrical field absorption layer 59.

In the light source 100 of the atomic oscillator 1000, the third electrode 60 for applying a voltage to the electrical field absorption layer 59 is provided on the surface where the first semiconductor layer 51 of the first contact layer 50 is disposed. Therefore, in the atomic oscillator 1000, the contact resistance of the third electrode 60 can be reduced compared to a case where the third electrode 60 is in direct contact with the first semiconductor layer 51.

2. Modification Example of Atomic Oscillator 2.1. First Modification Example

Figure 12:
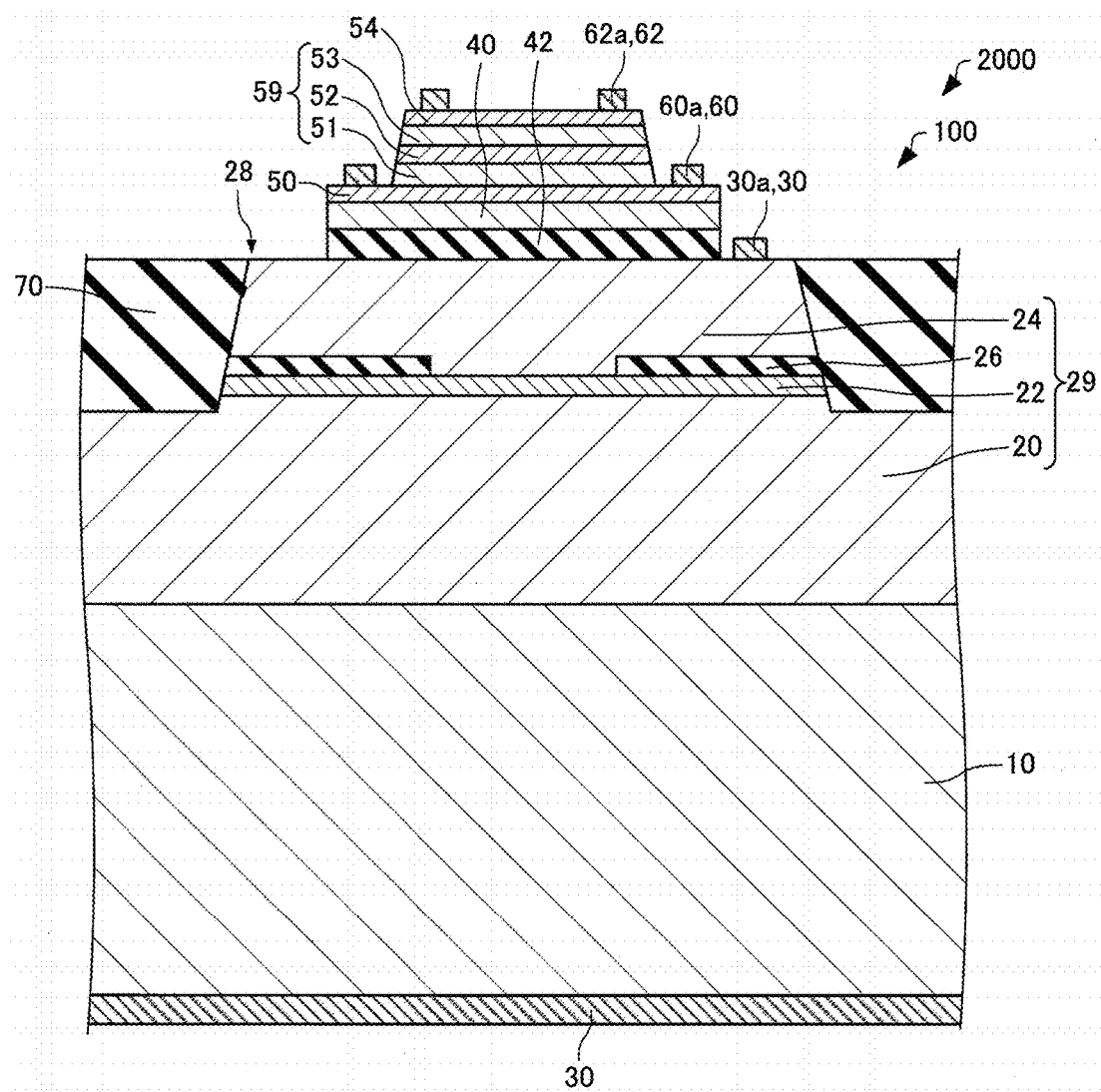
FIG. 12 is a sectional view schematically illustrating a light source of an atomic oscillator according to a first modification example of the present embodiment.

Next, an atomic oscillator according to a first modification example of the present embodiment will be described, referring to drawings. FIG. 12 is a sectional view schematically illustrating a light source 100 of an atomic oscillator 2000 according to a first modification example of the present embodiment.

Hereinafter, in the atomic oscillator 2000 according to the first modification example of the present embodiment, members having the same functions as those of the constituent members of the atomic oscillator 1000 according to the present embodiment will be designated by the same reference signs, and the detailed description thereof will be omitted. The same applies to an atomic oscillator according to a second modification example of the present embodiment to be described below.

The light source 100 of the atomic oscillator 2000, as illustrated in FIG. 12, is different from the light source 100 of the above-described atomic oscillator 1000 in that this light source has the heat insulating layer 42.

The heat insulating layer 42 is provided on the second reflective layer 24. The heat insulating layer 42 is provided between the second reflective layer 24 and the heat diffusion layer 40. A planar shape of the heat insulating layer 42 is, for example, circular. In the plan view, the area of the heat insulating layer 42 and the area of the heat diffusion layer 40 are, for example, the same as each other. The thermal conductivity of the heat insulating layer 42 is lower than the thermal conductivity of the second reflective layer 24. Specifically, the thermal conductivity of the heat insulating layer 42 is lower than the thermal conductivity of the high refractive-index layer that constitutes the second reflective layer 24, and is lower than the thermal conductivity of the low refractive-index layer that constitutes the second reflective layer 24. The heat insulating layer 42 is, for example, an aluminum oxide layer ($Al_xO_y$ layer). For example, the thermal conductivity of $Al_2O_3$ is 0.3 W/(cm·K).

The heat insulating layer 42 is formed, for example, by oxidizing an AlAs layer. A process of oxidizing an AlAs layer to form the heat insulating layer 42 may be performed simultaneously with a process of forming the current constriction layer 26. The AlAs layer used as the heat insulating layer 42 is formed by, for example, an MOCVD method.

The light source 100 of the atomic oscillator 2000 has the heat insulating layer 42 having a lower thermal conductivity than that of the second reflective layer 24 between the second reflective layer 24 and the heat diffusion layer 40. Therefore, in the atomic oscillator 2000, even if the electrical field absorption layer 59 absorbs light to generate heat, the heat insulating layer 42 can insulate this heat, and can prevent this heat from reaching the second reflective layer 24 or the active layer 22.

2.2. Second Modification Example

Figure 13:
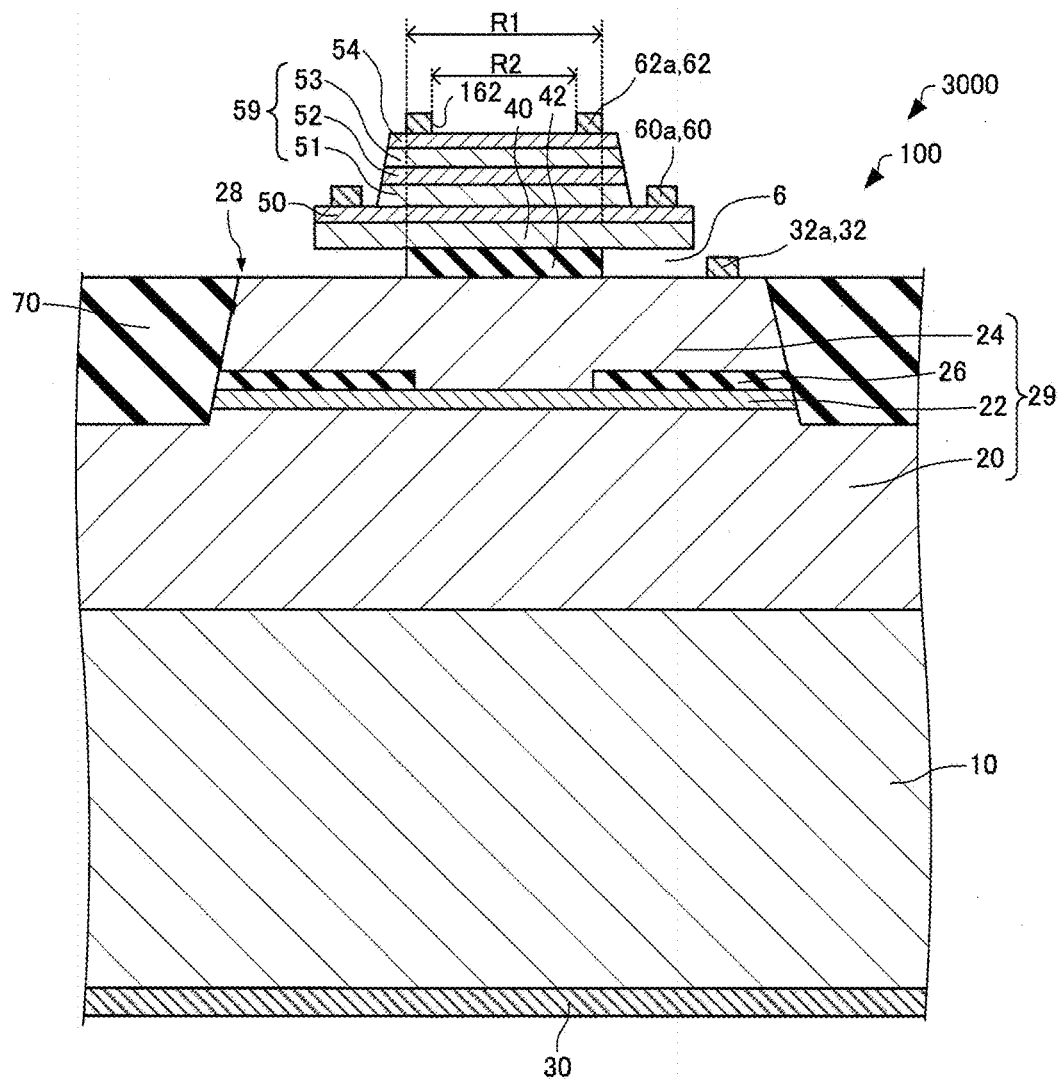
FIG. 13 is a sectional view schematically illustrating a light source of an atomic oscillator according to a second modification example of the present embodiment.
Figure 14:
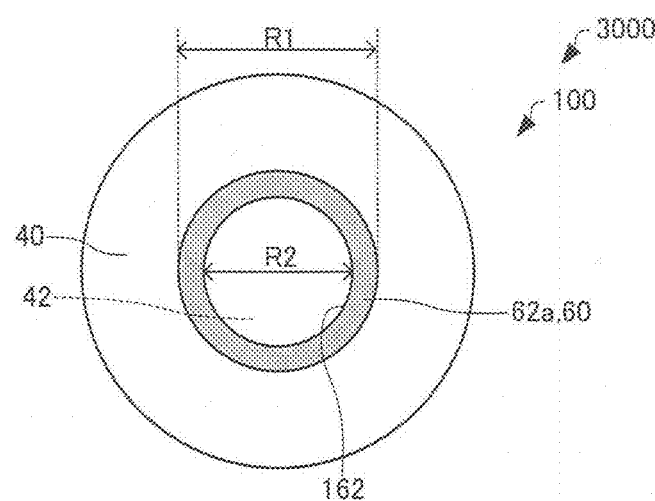
FIG. 14 is a plan view schematically illustrating the light source of the atomic oscillator according to the second modification example of the present embodiment.

Next, an atomic oscillator according to a second modification example of the present embodiment will be described, referring to drawings. FIG. 13 is a sectional view schematically illustrating a light source 100 of an atomic oscillator 3000 according to a second modification example of the present embodiment. FIG. 14 is a plan view schematically illustrating the light source 100 of an atomic oscillator 3000 according to a second modification example of the present embodiment. It should be noted that illustration of members other than the contacting part 62a of the fourth electrode 62, the heat diffusion layer 40, and the heat insulating layer 42, is omitted in FIG. 14 for convenience.

The light source 100 of the atomic oscillator 3000, as illustrated in FIGS. 13 and 14, is different from the light source 100 of the above-described atomic oscillator 1000 in that this light source has the heat insulating layer 42.

In the light source 100 of the atomic oscillator 3000, in the plan view, the area of the heat insulating layer 42 is smaller than the area of the heat diffusion layer 40. The heat insulating layer 42, in the plan view, is provided inside the outer edge of the heat diffusion layer 40. A space 6 is provided between the second reflective layer 24 and the heat diffusion layer 40. In the illustrated example, in the plan view, a diameter R1 of the heat insulating layer 42 has the same size as the external diameter of the contacting part 62a of the fourth electrode 62, and the diameter R1 is greater than an internal diameter R2 of the contacting part 62a. In the plan view, the area of the heat insulating layer 42 is greater than the area of an opening 162 defined by the contacting part 62a, and the opening 162 is provided inside an outer edge of the heat insulating layer 42. Moreover, in the illustrated example, in the plan view, the diameter R1 of the heat insulating layer 42 is greater than the internal diameter of the opening provided in the current constriction layer 26.

The heat insulating layer 42 can be adjusted in the diameter R1, for example, by being selectively etched with hydrogen fluoride (HF). When the heat insulating layer 42 is etched with the hydrogen fluoride, the current constriction layer 26 is protected by a resist or the like.

In the light source 100 of the atomic oscillator 3000, in the plan view, the area of the heat insulating layer 42 is smaller than the area of the heat diffusion layer 40. Therefore, in the atomic oscillator 3000, the space 6 is provided between the second reflective layer 24 and the heat diffusion layer 40. Accordingly, in the atomic oscillator 3000, even if the electrical field absorption layer 59 absorbs light to generate heat, the heat insulating layer 42 and the space 6 can insulate this heat, and can prevent this heat from reaching the second reflective layer 24 or the active layer 22.

In the light source 100 of the atomic oscillator 3000, in the plan view, the area of the heat insulating layer 42 is greater than the area of the opening 162 defined by the contacting part 62a, and the opening 162 is provided inside the outer edge of the heat insulating layer 42. Therefore, in the atomic oscillator 3000, the light generated in the active layer 22 and exited from the upper surface of the second contact layer 54 can be prevented from passing through a boundary between the heat insulating layer 42 and the space 6. Accordingly, in the atomic oscillator 3000, scattering or loss of light in the boundary between the heat insulating layer 42 and the space 6 can be suppressed.

Figure 15:
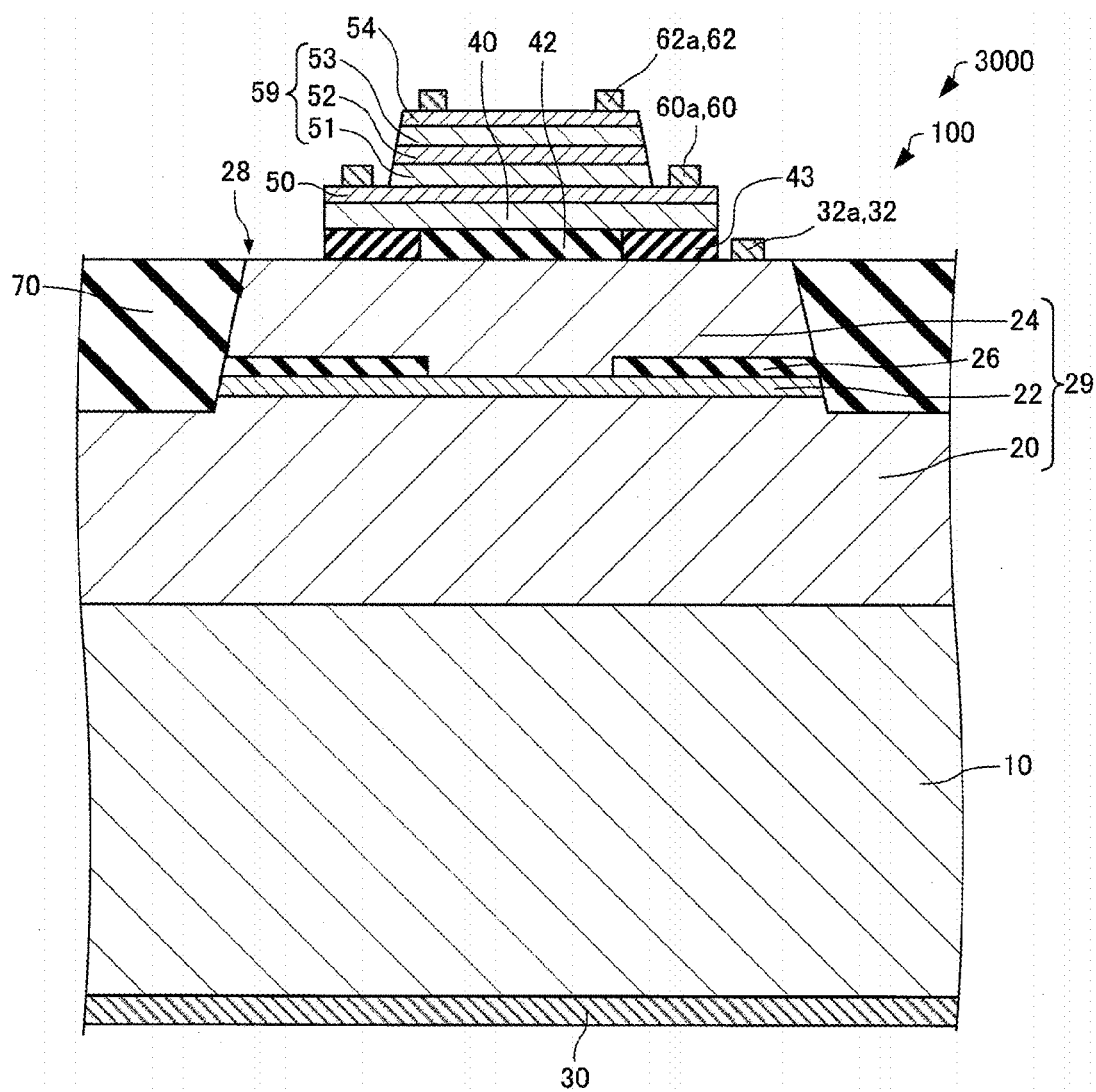
FIG. 15 is a sectional view schematically illustrating the light source of the atomic oscillator according to the second modification example of the present embodiment.

It should be noted that, as illustrated in FIG. 15, the low thermal conductivity layer 43 having a lower thermal conductivity than that of the heat insulating layer 42 may be provided around the heat insulating layer 42. In other words, in a plan view of the heat insulating layer 42, the heat insulating layer 42 may be surrounded by the low thermal conductivity layer 43. The low thermal conductivity layer 43 is provided between the second reflective layer 24 and the heat diffusion layer 40. The low thermal conductivity layer 43 is, for example, a polyimide layer. For example, the thermal conductivity of polyimide is 0.018 W/(cm·K). The low thermal conductivity layer 43 is formed by, for example, a CVD method or a spin coating method. By providing the low thermal conductivity layer 43, shock resistance can be improved compared with a case (a case illustrated in FIG. 13) where the space 6 is provided between the second reflective layer 24 and heat diffusion layer 40. Moreover, even if the electrical field absorption layer 59 absorbs light to generate heat, the heat insulating layer 42 and the low thermal conductivity layer 43 can insulate this heat, and can prevent this heat from reaching the second reflective layer 24 or the active layer 22.

The invention may be provided by omitting a partial configuration in a range having the features and the effects described in the present application or combining each embodiment or the modification examples.

The invention includes substantially the same configuration as the configuration described in the embodiment (for example, a configuration having the same functions, methods, and results as those of the configuration described in the embodiment, or a configuration having the same object and effects as those of the configuration described in the embodiment). Additionally, the invention includes a configuration in which parts that are not essential to the configuration described in the embodiment are substituted. Additionally, the invention includes a configuration in which the same functional effects as those of the configuration described in the embodiment can be exhibited or a configuration in which the same object as that of the configuration described in the embodiment can be achieved.

Additionally, the invention includes a configuration in which well-known techniques are added to the configuration described in the embodiment.

The entire disclosure of Japanese Patent Application No. 2015-210824, filed Oct. 27, 2015 is expressly incorporated by reference herein.

What is claimed is:

1. An atomic oscillator comprising:
   a gas cell having alkali metal atoms sealed therein;
   a light source that irradiates the gas cell with light; and
   a light detecting unit that detects the quantity of light transmitted through the gas cell,
   wherein the light source includes
   an optical oscillation layer having a first reflective layer, an active layer, and a second reflective layer laminated therein in this order,
   an electrical field absorption layer having a first semiconductor layer, a quantum well layer, and a second semiconductor layer laminated therein in this order, and
   a heat diffusion layer that is disposed between the optical oscillation layer and the electrical field absorption layer and has a higher thermal conductivity than that of the second reflective layer.

2. The atomic oscillator according to claim 1, wherein the heat diffusion layer is an i-type AlAs layer.

3. The atomic oscillator according to claim 1, wherein the heat diffusion layer is an i-type GaAs layer.

4. The atomic oscillator according to claim 1, further comprising:
a contact layer provided between the heat diffusion layer and the first semiconductor layer,
wherein a surface of the contact layer where the first semiconductor layer is disposed is provided with an electrode for applying a voltage to the electrical field absorption layer.

* * * * *